(12) United States Patent
Chin et al.

(10) Patent No.: US 10,256,340 B2
(45) Date of Patent: Apr. 9, 2019

(54) HIGH-VOLTAGE SEMICONDUCTOR DEVICE AND METHOD FOR MANUFACTURING THE SAME

(71) Applicant: Vanguard International Semiconductor Corporation, Hsinchu (TW)

(72) Inventors: Yu-Lung Chin, Tainan (TW); Shin-Cheng Lin, Tainan (TW); Wen-Hsin Lin, Jhubei (TW); Cheng-Tsung Wu, Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/140,780

(22) Filed: Apr. 28, 2016

(65) Prior Publication Data

US 2017/0317208 A1    Nov. 2, 2017

(51) Int. Cl.
| | | |
|---|---|---|
| *H01L 29/94* | (2006.01) | |
| *H01L 29/78* | (2006.01) | |
| *H01L 29/66* | (2006.01) | |
| *H01L 29/423* | (2006.01) | |
| *H01L 21/761* | (2006.01) | |
| *H01L 29/06* | (2006.01) | |
| *H01L 29/10* | (2006.01) | |

(52) U.S. Cl.
CPC .... *H01L 29/7816* (2013.01); *H01L 29/66681* (2013.01); *H01L 29/7835* (2013.01); *H01L 21/761* (2013.01); *H01L 29/063* (2013.01); *H01L 29/1083* (2013.01); *H01L 29/42368* (2013.01)

(58) Field of Classification Search
CPC ............ H01L 29/7816; H01L 29/0649; H01L 29/1095; H01L 29/66681; H01L 29/0692; H01L 29/7835
USPC ........................................................ 257/343
See application file for complete search history.

(56) References Cited

U.S. PATENT DOCUMENTS

| | | |
|---|---|---|
| 6,903,421 B1 | 6/2005 | Huang et al. |
| 7,960,786 B2 | 6/2011 | Huang et al. |
| 9,054,129 B1 * | 6/2015 | Tu .................... H01L 29/6659 |

(Continued)

FOREIGN PATENT DOCUMENTS

| | | |
|---|---|---|
| TW | 201251007 A1 | 12/2012 |
| TW | 201403817 A | 1/2014 |

*Primary Examiner* — Kevin M Picardat
(74) *Attorney, Agent, or Firm* — Birch, Stewart, Kolasch & Birch, LLP

(57) ABSTRACT

A high-voltage semiconductor device is provided. The device includes a semiconductor substrate having a first conductivity type, and a first doping region having a second conductivity type therein. An epitaxial layer is on the semiconductor substrate. A body region having the first conductivity type is in the epitaxial layer on the first doping region. A second doping region and a third doping region that have the second conductivity type are respectively in the epitaxial layer on both opposite sides of the body region, so as to adjoin the body region. Source and drain regions are respectively in the body region and the second doping region. A field insulating layer is in the second doping region between the source and drain regions. A gate structure is on the epitaxial layer to cover a portion of the field insulating layer.

26 Claims, 8 Drawing Sheets

(56) References Cited

U.S. PATENT DOCUMENTS

| | | | |
|---|---|---|---|
| 2004/0108544 A1 | 6/2004 | Hossain et al. | |
| 2010/0148253 A1* | 6/2010 | Tu | H01L 29/7835 |
| | | | 257/337 |
| 2010/0187566 A1* | 7/2010 | Jou | H01L 29/7393 |
| | | | 257/137 |
| 2011/0220995 A1 | 9/2011 | Chou et al. | |
| 2013/0270606 A1* | 10/2013 | Chen | H01L 29/7835 |
| | | | 257/183 |
| 2013/0307072 A1 | 11/2013 | Huang et al. | |
| 2013/0341717 A1* | 12/2013 | Chen | H01L 29/66659 |
| | | | 257/337 |
| 2014/0027856 A1* | 1/2014 | Chao | H01L 27/027 |
| | | | 257/355 |
| 2015/0041890 A1 | 2/2015 | Campi, Jr. et al. | |
| 2015/0243783 A1* | 8/2015 | Lee | H01L 29/7835 |
| | | | 257/339 |
| 2016/0099340 A1* | 4/2016 | Hsu | H01L 29/66689 |
| | | | 257/339 |
| 2016/0285261 A1* | 9/2016 | Laine | H02H 9/046 |

* cited by examiner

HIGH-VOLTAGE SEMICONDUCTOR DEVICE AND METHOD FOR MANUFACTURING THE SAME

BACKGROUND

Field of the Disclosure

The present disclosure relates to a semiconductor technology, and in particular, it relates to a high-voltage semiconductor device that is capable of reducing or eliminating body effect.

Description of the Related Art

High-voltage semiconductor technology is applied to integrated circuits (ICs) with high voltage and high power. Traditional high-voltage semiconductor devices, such as lateral diffused MOSFETs (LDMOSFETs), are mainly used for devices with at least 18 volts or higher. The advantages of high-voltage device technology include cost effectiveness and process compatibility, and thus high-voltage device technology has been widely used in display driver IC devices, and power supply devices, and power management, communications, autotronics, and industrial control fields, etc.

FIG. 1 is a cross section of a conventional n-type LDMOSFET. The n-type LDMOSFET 10 includes a p-type semiconductor substrate 200 and a p-type epitaxial layer 102 thereon. A gate structure 116 and a field oxide layer 114 are on the p-type epitaxial layer 102. Moreover, a p-type body region 106 and an n-type drift region 104 are respectively in the p-type epitaxial layer 102 on both sides of the gate structure 116. The n-type drift region 104 further extends into the underlying p-type semiconductor substrate 200. A p-type contact region 108 and an adjacent n-type contact region 110 (or both referred to as a source region) are in the body region 106 and an n-type contact region 112 (or referred to as a drain region) is in the drift region 104. Moreover, a source electrode 117 is electrically connected to the p-type contact region 108 and the n-type contact region 110. A drain electrode 119 is electrically connected to the n-type contact region 112. A gate electrode 121 is electrically connected to the gate structure 116.

In such an n-type LDMOSFET 10, however, the source region is electrically connected to the underlying p-type semiconductor substrate 200 via the body region 106. Therefore, the body effect is induced to change the threshold voltage of the transistor 10 when the source region is coupled to an internal circuit or resistor. As a result, the driving current of the transistor 10 is reduced with increasing the voltage applied to the source region, and thus the performance of the transistor 10 is reduced.

Therefore, there is a need to develop a high-voltage semiconductor device and a method for manufacturing the same that are capable of addressing or mitigating the problems described above.

SUMMARY

In some embodiments of the disclosure, a high-voltage semiconductor device is provided. The high-voltage semiconductor device includes a semiconductor substrate having a first conductivity type. A first doping region having a second conductivity type is in the semiconductor substrate. The high-voltage semiconductor device further includes an epitaxial layer is on the semiconductor substrate. A body region having the first conductivity type is in the epitaxial layer on the first doping region, and a second doping region and a third doping region that have the second conductivity type are respectively in the epitaxial layer on both opposite sides of the body region, so as to adjoin the body region. A source region and a drain region are respectively in the body region and the second doping region. A field insulating layer is in the second doping region between the source region and the drain region. The device further includes a gate structure on the epitaxial layer to cover a portion of the field insulating layer.

In some embodiments of the disclosure, a method for fabricating a high-voltage semiconductor device is provided. The method includes providing a semiconductor substrate having a first conductivity type. A first doping region having a second conductivity type is formed in the semiconductor substrate. An epitaxial layer is formed on the semiconductor substrate. A body region having the first conductivity type is formed in the epitaxial layer and a second doping region and a third doping region that have the second conductivity type are respectively formed in the epitaxial layer, wherein the body region is on the first doping region, and the second and third doping regions are on both opposite sides of the body region, so as to adjoin the body region. A field insulating layer is formed in the second doping region. A gate structure is formed on the epitaxial layer, wherein the gate structure covers a portion of the field insulating layer. A source region is formed in the body region and a drain region is formed in the second doping region.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1:
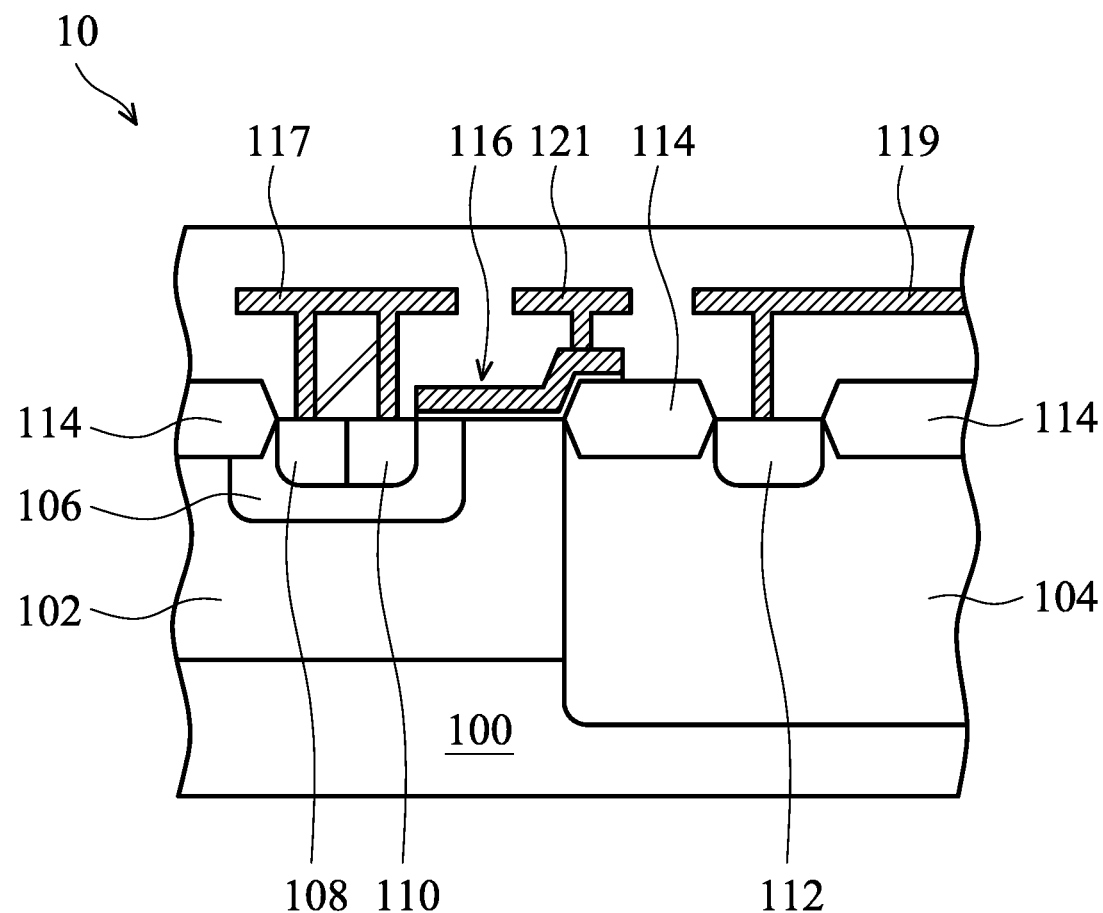
FIG. 1 is a cross section of a conventional n-type LDMOSFET.

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

An exemplary embodiment of the present disclosure provides a high-voltage semiconductor device, such as an LDMOSFET, which utilizes a doping region having a conductivity type different from that of the body region to isolate the body region from the substrate that has the same conductivity type as that of the body region, thereby reduce or eliminate the body effect.

Figure 2A:
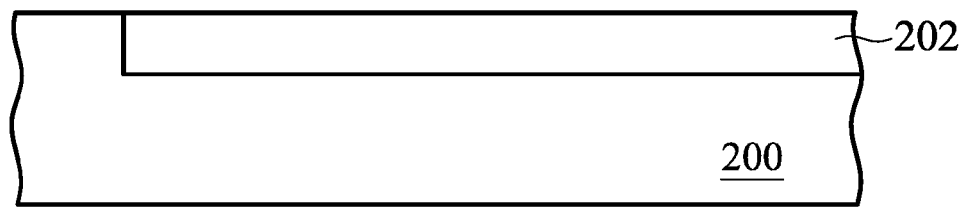
FIGS. 2A to 2F are cross sections of a method for fabricating a high-voltage semiconductor device according to an embodiment of the present disclosure.
Figure 2B:
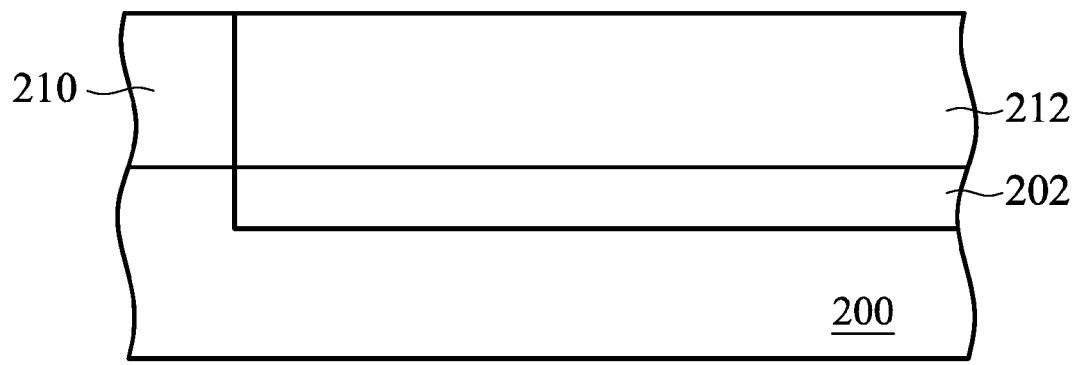
Figure 2C:
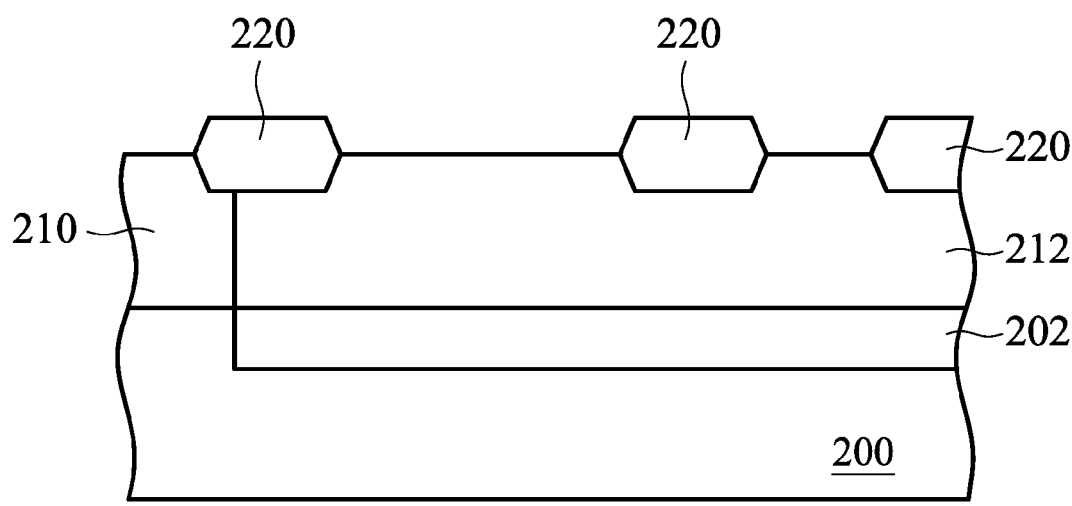
Figure 2D:
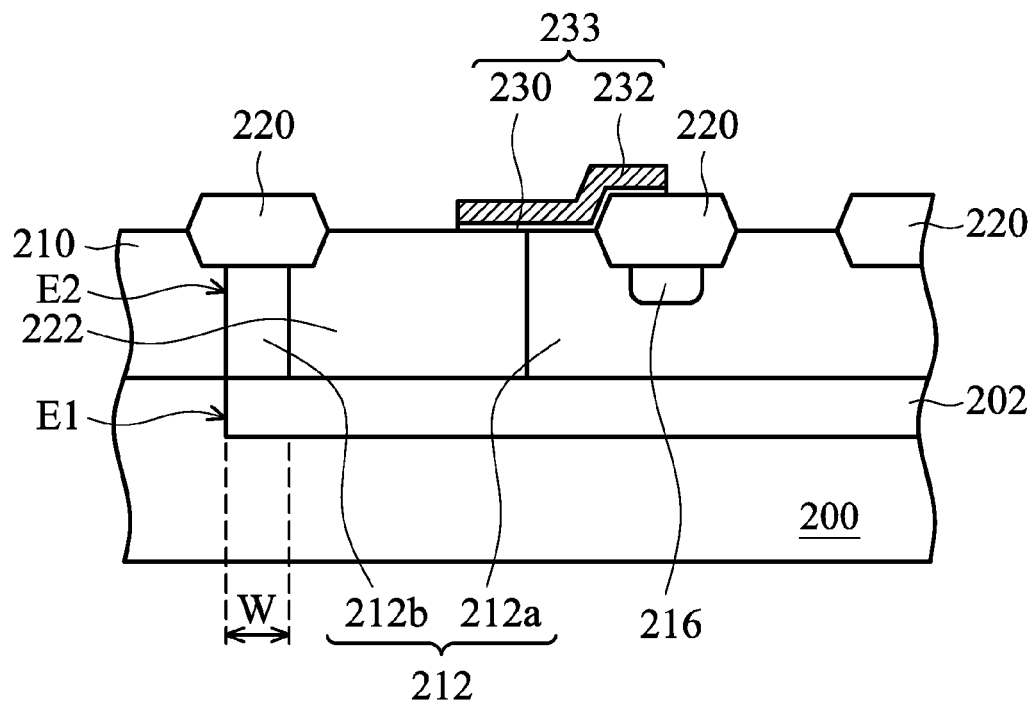
Figure 2E:
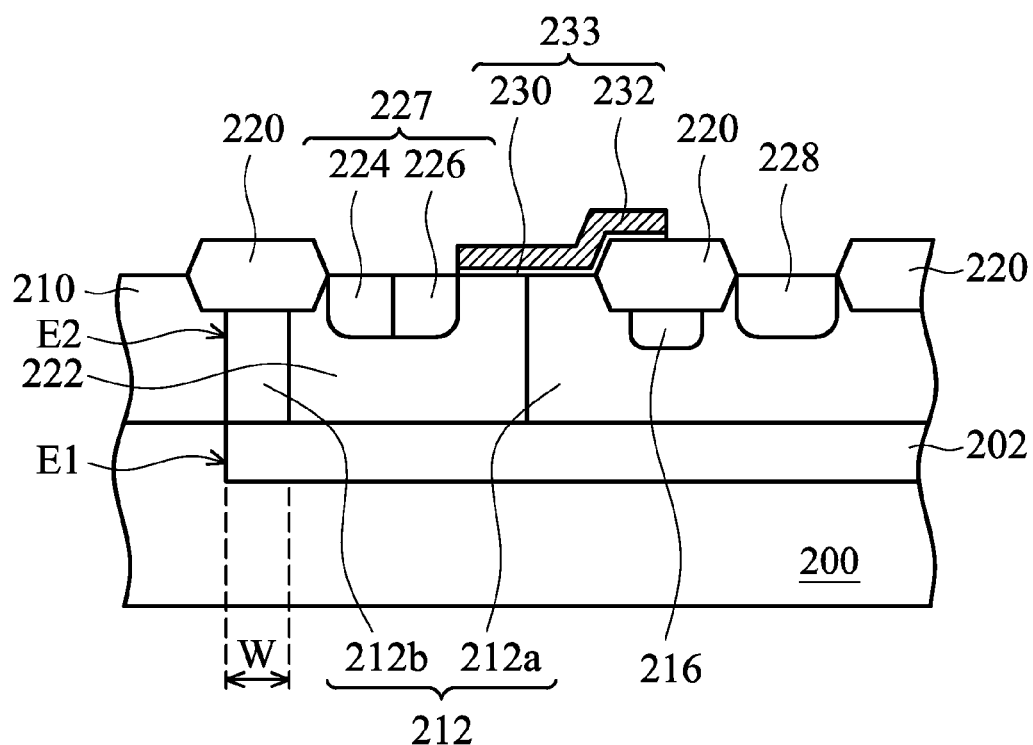
Figure 2F:
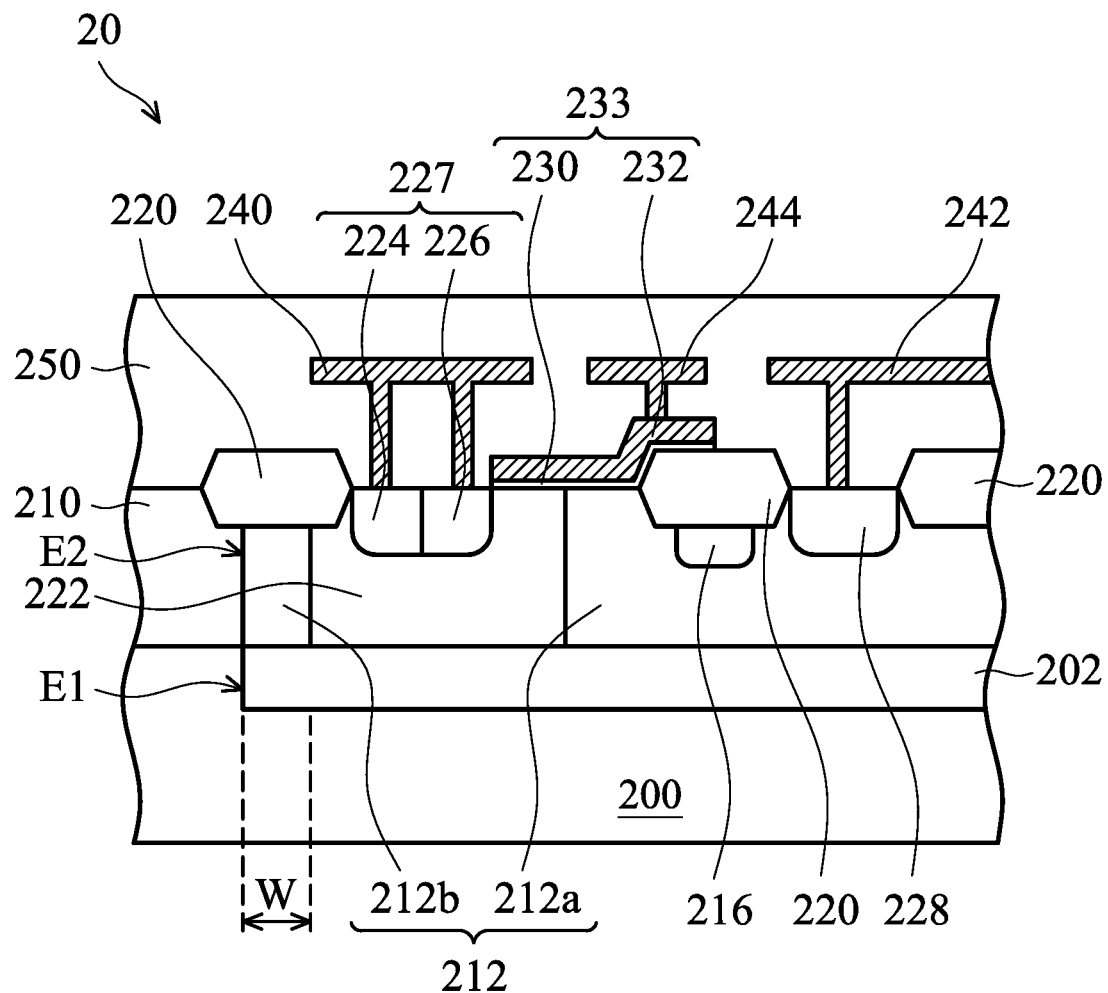

Refer to FIG. 2F, which illustrates a cross section of an exemplary embodiment of a high-voltage semiconductor device 20 according to the present disclosure. In the embodiment, the high-voltage semiconductor device 20 may be an LDMOSFET. The high-voltage semiconductor device 20 includes a semiconductor substrate 200, such as a silicon substrate, a SiGe substrate, a bulk semiconductor substrate, a compound semiconductor substrate, a silicon-on-insulator (SOI) substrate, or another well-known semiconductor substrate, having a first conductivity type.

Moreover, the semiconductor substrate 200 includes a first doping region 202 (such as a high-voltage well region) therein. The first doping region 202 is adjacent to the upper surface of the semiconductor substrate 200. The first doping region 202 has a conductivity type different from the first conductivity type. For example, the first conductivity type is p-type and the second conductivity type is n-type. In some embodiments, the first conductivity type is n-type and the second conductivity type is p-type.

In the embodiment, the high-voltage semiconductor device 20 further includes an epitaxial layer 210 that is formed on the semiconductor substrate 200 and has the first conductivity type. The epitaxial layer 210 includes a plurality of field insulating layers 220 that serves as an isolation structure. In one embodiment, the field insulating layer 220 is a field oxide. In one example, the field insulating layer 220 includes a local oxidation of silicon (LOCOS) structure. In some embodiments, the field insulating layer 220 includes a shallow trench isolation (STI) structure.

In the embodiment, the high-voltage semiconductor device 20 further includes a body region 222 having the first conductivity type and second and third doping regions 212a and 212b having the second conductivity type. The body region 222 is in the epitaxial layer 210 over the first doping region 202 and extends from the upper surface of the epitaxial layer 210 to the lower surface thereof, so that the bottom of the body region 22 may adjoin to the first doping region 202. Moreover, the second and third doping regions 212a and 212b are in the epitaxial layer 210 on both opposite sides of the body region 222, respectively, to adjoin the body region 222. In the embodiment, the second and third doping regions 212a and 212b are disposed over the first doping region 202 and extend from the upper surface of the epitaxial layer 210 to the lower surface thereof, so that the bottom of the second and third doping regions 212a and 212b may adjoin to the first doping region 202. In one embodiment, an exterior edge E2 of the third doping region 212b is aligned with a corresponding exterior edge E1 of the first doping region 202. Moreover, the third doping region 212b has a width W in a range of about 1 μm to 8 μm.

In one embodiment, the first doping region 202 has the same doping concentration as that of the second and third doping regions 212a and 212b. In this case, the first doping region 202 and the second and third doping regions 212a and 212b are high-voltage well regions. Moreover, the second and third doping regions 212a and 212b may be formed by separating a high-voltage well region via the body region 222 or be individual high-voltage well regions formed in the epitaxial layer 210. In one embodiment, the high-voltage well region has a doping concentration in a range of about $1.0 \times 10^{15}$ to $1.0 \times 10^{16}$ ions/cm$^3$. In some embodiments, the first doping region 202 has a doping concentration that is the same as that of the second doping region 212a and different from that of the third doping region 212b. In these cases, the first doping region 202 and the second doping region 212a are high-voltage well regions and the third doping region 212b is a well region. The well region (i.e., the third doping region 212b) has a doping concentration greater than that of the high-voltage well region (i.e., the first doping region 202 or the second doping region 212a). Namely, the second and third doping regions 212a and 212b may be formed by separating a high-voltage well region via the body region 222 or be a high-voltage well region and a well region that are respectively formed in epitaxial layer 210. In one example, the high-voltage well region has a doping concentration in a range of about $1.0 \times 10^{15}$ to $1.0 \times 10^{16}$ ions/cm$^3$, and the well region has a doping concentration in a range of about $1.0 \times 10^{16}$ to $1.0 \times 10^{17}$ ions/cm$^3$. In the embodiment, the first doping region 202, the second doping region 212a, and the third doping region 212b serve as a drift region of the LDMOSFET.

In the embodiment, the high-voltage semiconductor device 20 further includes a source region 227, a drain region 228, and a gate structure 233. The source region 227 and the drain region 228 are respectively disposed in the body region 222 and the second doping region 212a. The source region 227 is formed of a doping region 226 having the second conductivity type and a doping region (which serves as a body contact region) 224 having the first conductivity type. Moreover, the drain region 228 is merely formed of a doping region having the second conductivity type. Furthermore, the gate structure 23 is disposed on the epitaxial layer 210 and covers a portion of the field insulating layer 220, in which this field insulating layer 220 is formed in the second doping region 212a between the source region 227 and the drain region 228. The gate structure 233 typically includes a gate dielectric layer 230 and a gate layer 232 on the gate dielectric layer 230.

In the embodiment, the high-voltage semiconductor device 20 may include a field reduction region 216 having the first conductivity type that is disposed in the second doping region 212a below the field insulating layer 220 under the gate structure 233, so as to reduce surface field. In one embodiment, the field reduction region 216 has a doping concentration of about $1.0 \times 10^{17}$ ions/cm$^3$.

In the embodiment, the high-voltage semiconductor device 20 further includes an interlayer dielectric (ILD) layer 250. Interconnect structures 240, 242, and 244 are in the ILD layer 250. In the embodiment, the interconnect structure 240 is electrically connected to the source region 227 to serve as a source electrode, the interconnect structure 242 is electrically connected to the drain region 228 to serve as a drain electrode, and the interconnect structure 244 is electrically connected to the gate structure 233 to serve as a gate electrode.

Figure 3A:
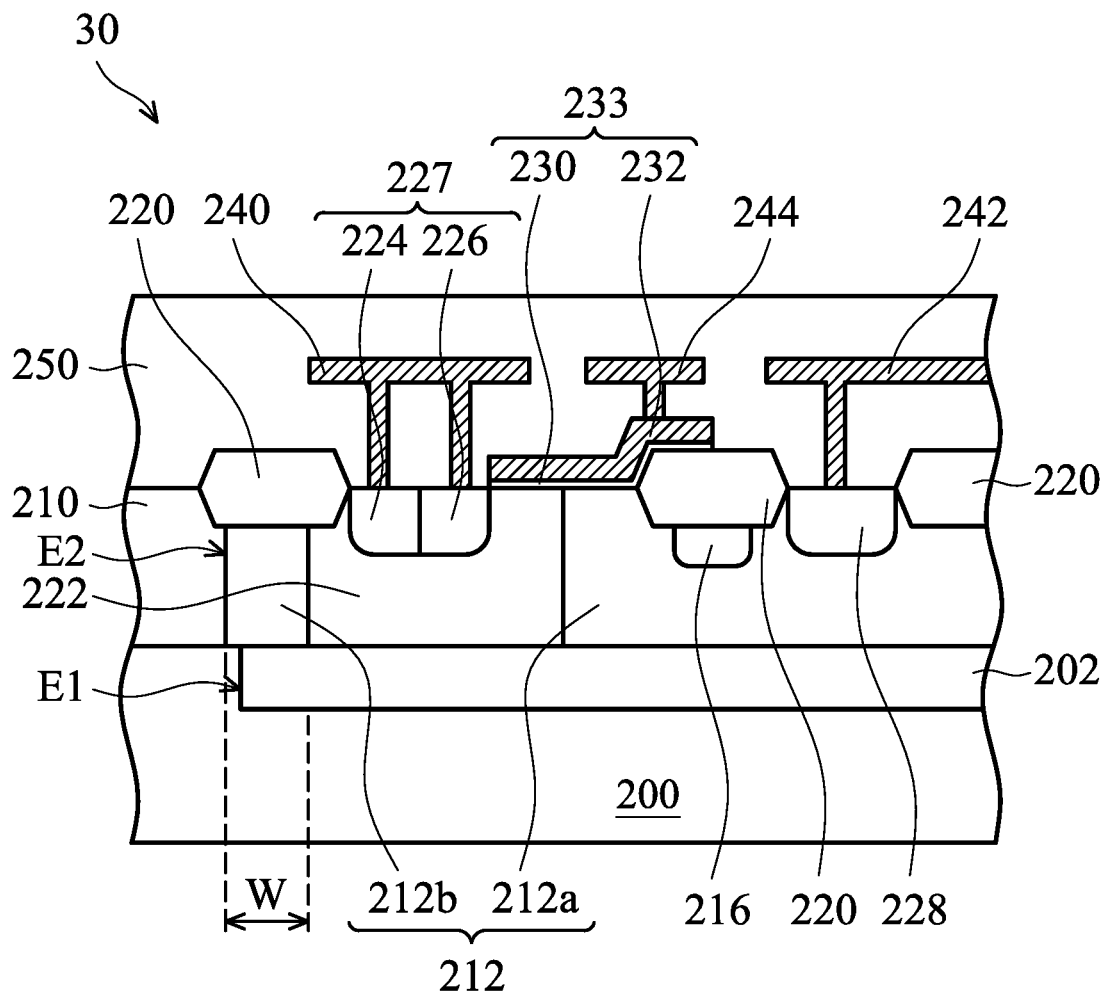
FIGS. 3A to 3D are cross sections of various high-voltage semiconductor devices according to some embodiments of the present disclosure.
Figure 3B:
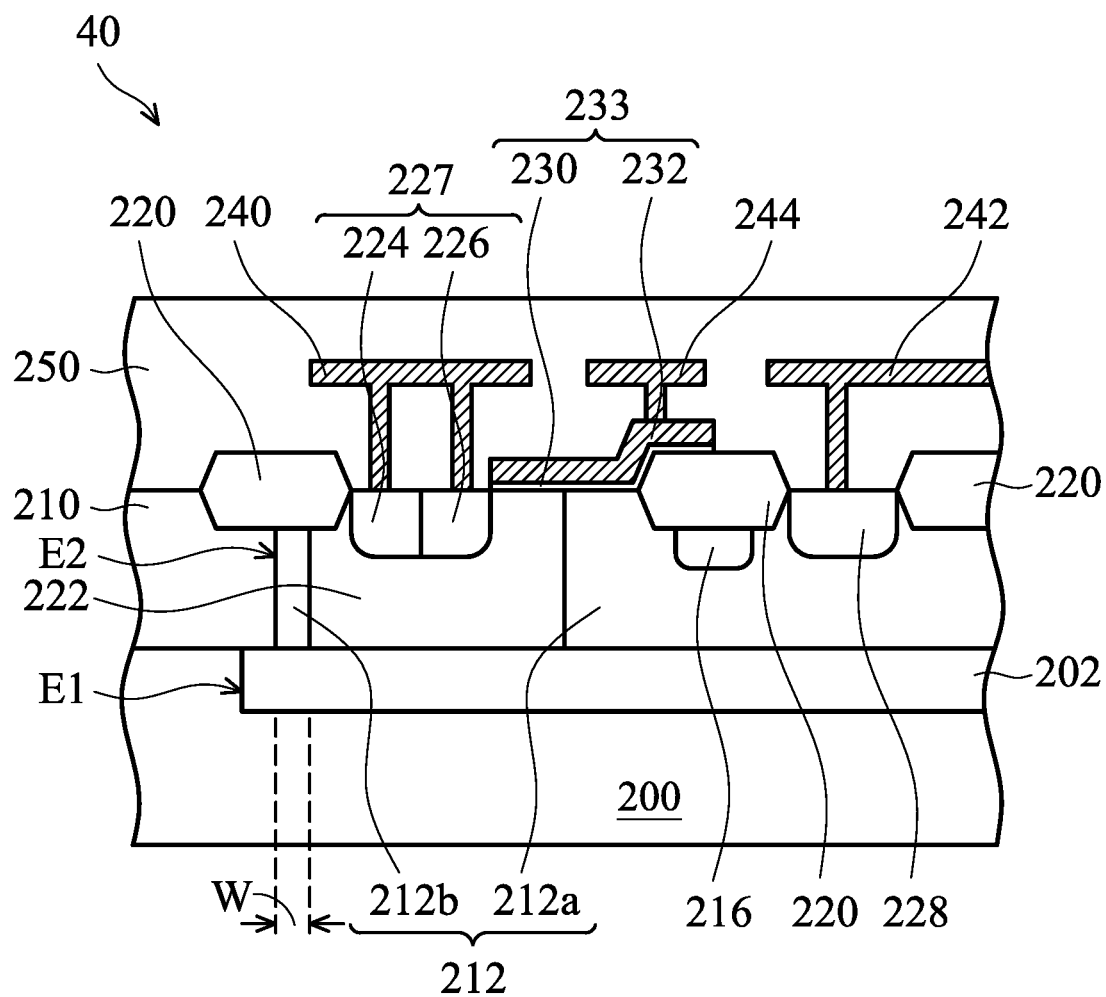

Refer to FIGS. 3A and 3B, which are cross sections of high-voltage semiconductor devices 30 and 40, respectively, according to some embodiments of the present disclosure. Elements in FIGS. 3A and 3B that are the same as or similar to those in FIG. 2F are not described again, for brevity. In FIG. 3A, the high-voltage semiconductor device 30 has a structure that is similar to that of the high-voltage semiconductor device 20 (shown in FIG. 2F). The difference is that the exterior edge E2 of the third doping region 212b in the high-voltage semiconductor device 30 is not aligned with the corresponding exterior edge E1 of the first doping region 212a. For example, the exterior edge E2 laterally extends beyond the exterior edge E1.

In FIG. 3B, the high-voltage semiconductor device 40 has a structure that is similar to that of the high-voltage semiconductor device 20 (shown in FIG. 2F). The difference is that the exterior edge E2 of the third doping region 212b in the high-voltage semiconductor device 40 is not aligned with the corresponding exterior edge E1 of the first doping region 212a. For example, the exterior edge E1 laterally extends beyond the exterior edge E2.

Figure 3C:
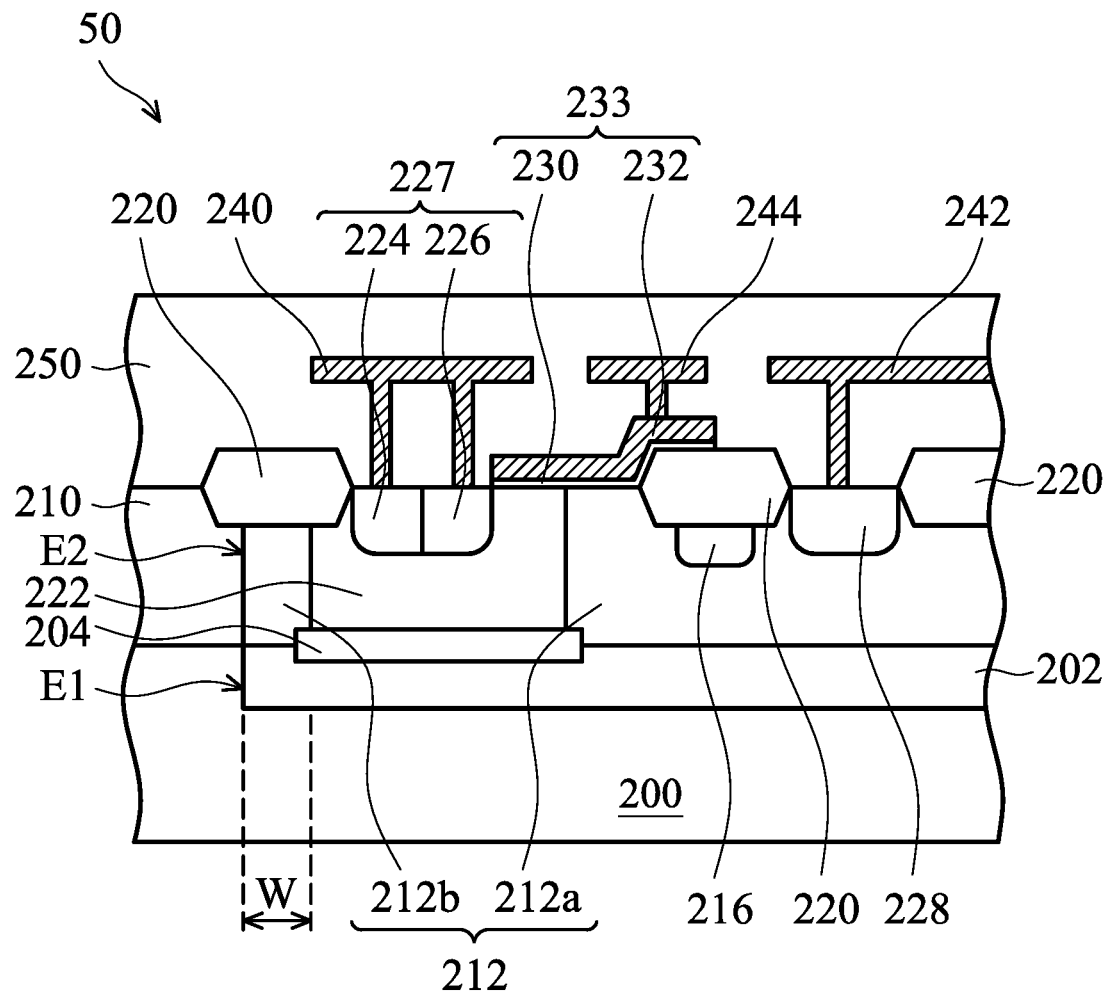

Refer to FIG. 3C, which is a cross section of a high-voltage semiconductor device 50 according to some embodiments of the present disclosure. Elements in FIG. 3C that are the same as or similar to those in FIG. 2F are not described again, for brevity. In the embodiment, the high-voltage semiconductor device 50 has a structure that is similar to that of the high-voltage semiconductor device 20 (shown in FIG. 2F). The difference is that the high-voltage semiconductor device 50 further includes a buried layer 204 having the second conductivity type that is in first doping region 202 below the body region 222, so that the bottom of the body region 222 adjoins the upper surface of the buried layer 204. Moreover, the buried layer 204 has a doping concentration of about $1.0 \times 10^{18}$ ions/cm$^3$. In the embodiment, the second doping region 212a and the third doping region 212b are high-voltage well regions or a high-voltage well region and a well region, respectively. In one example, the second conductivity type is n-type and the buried layer 204 is an n$^+$ buried layer (NBL).

Figure 3D:
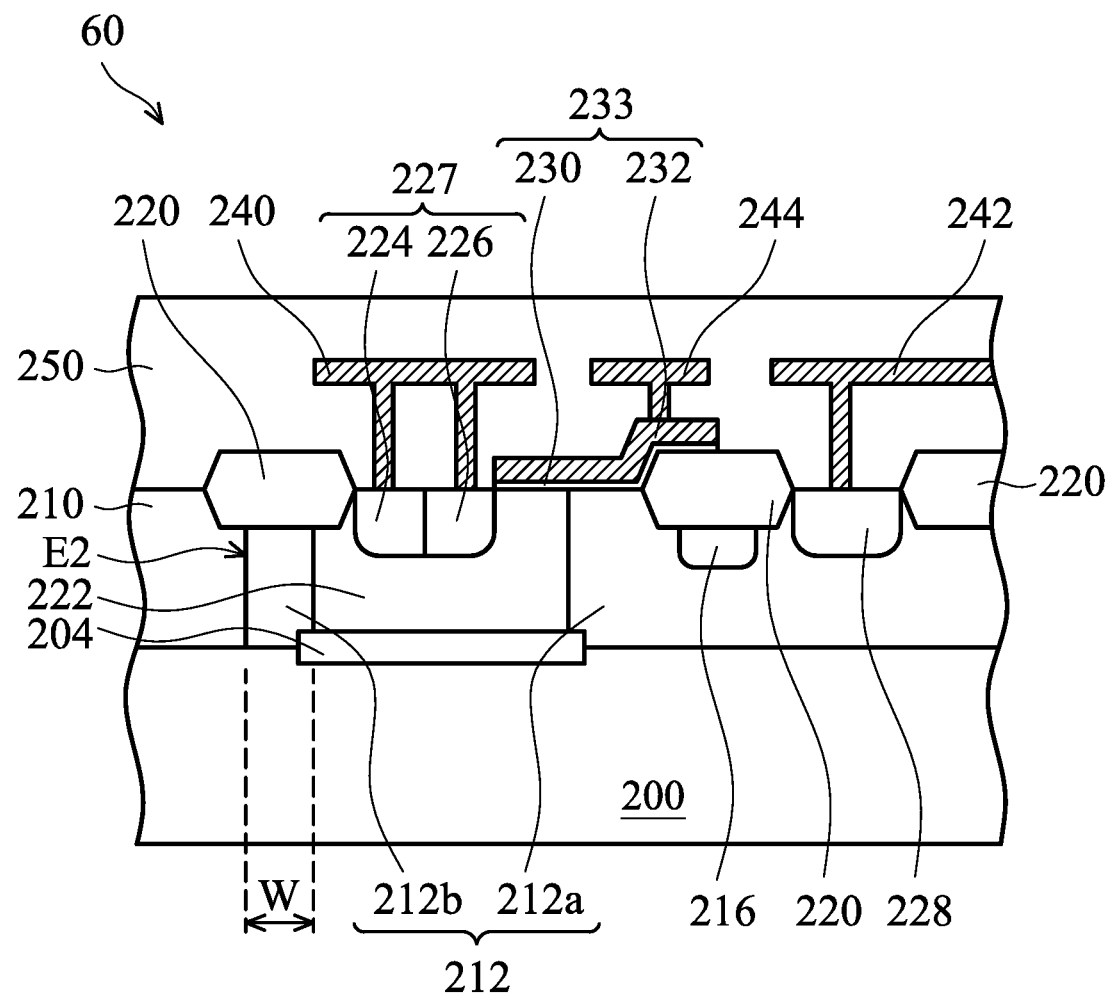

Refer to FIG. 3D, which is a cross section of a high-voltage semiconductor device 60 according to some embodiments of the present disclosure. Elements in FIG. 3D that are the same as or similar to those in FIG. 2F are not described again, for brevity. In the embodiment, the high-voltage semiconductor device 60 has a structure that is similar to that of the high-voltage semiconductor device 20 (shown in FIG. 2F). The difference is that the high-voltage semiconductor device 60 utilizes a buried layer 204 having the second conductivity type that is disposed below the body region 222 to replace the first doping region 202 in the high-voltage semiconductor device 20, so that the bottom of the body region 222 adjoins the upper surface of the buried layer 204. In the embodiment, the second doping region 212a and the third doping region 212b are high-voltage well regions or a high-voltage well region and a well region, respectively.

Next, refer to FIGS. 2A to 2F, which are cross sections of a method for fabricating a high-voltage semiconductor device 20 according to an embodiment of the present disclosure. In FIG. 2A, a semiconductor substrate 200 having a first conductivity type is provided. In the embodiment, the semiconductor substrate 200 may be a silicon substrate, a SiGe substrate, a bulk semiconductor substrate, a compound semiconductor substrate, an SOI substrate, or another well-known semiconductor substrate.

Next, a first doping region 202, such as a high-voltage well region, may be formed in the semiconductor substrate 200 by an ion implantation process and a thermal process. The first doping region 202 is adjacent to the upper surface of the semiconductor substrate 200. The first doping region 202 has a second conductivity type different from the first conductivity type. For example, the first conductivity type is p-type and the second conductivity type is n-type. In some embodiments, the first conductivity type is n-type and the second conductivity type is p-type.

Next, Refer to FIG. 2B, an epitaxial layer 210 having the first conductivity type is formed on the semiconductor substrate 200 by an epitaxial growth process. Next, a doping region having the second conductivity type, such as a high-voltage well region 212, may be formed in the epitaxial layer 210 by an ion implantation process and a thermal process. In the embodiment, the high-voltage well region 212 and the first doping region 202 have a doping concentration in a range of about $1.0 \times 10^{15}$ to $1.0 \times 10^{16}$ ions/cm$^3$.

Next, refer to FIG. 2C, field insulating layers 220 serving as isolation structures are formed in the epitaxial layer 210, in which at least one of the field insulating layers 220 is formed in the high-voltage well region 212. In one embodiment, the field insulating layer 220 includes a LOCOS structure. In some embodiments, the field insulating layer 220 includes an STI structure. Note that in some embodiments, the high-voltage well region 212 that has the second conductivity type may be formed in the epitaxial layer 210 after the field insulating layers 220 are formed.

Next, refer to FIG. 2D, a body region 222 having the first conductivity type may be formed in the high-voltage well region 212 of the epitaxial layer 210 by an ion implantation process and a thermal process, thereby dividing the high-voltage well region 212 into a second doping region 212a and a third doping region 212b that have the second conductivity type and the same doping concentration. As shown in FIG. 2D, the body region 222 is formed in the epitaxial layer 210 on the first doping region 202 and extends from the upper surface of the epitaxial layer 210 to the lower surface thereof, so that the bottom of the second and third doping regions 212a and 212b may adjoin to the first doping region 202. In one embodiment, an exterior edge E2 of the third doping region 212b is aligned with a corresponding exterior edge E1 of the first doping region 202. Moreover, the third doping region 212b has a width W in a range of about 1 μm to 8 μm. In some embodiment, the second and third doping regions 212a and 212b may be formed by the respective ion implantation processes before or after the body region 222 is formed.

In these cases, the second doping region 212a has a doping concentration that is the same as that of the first doping region 202 and the third doping region 212b. For example, the first doping region 202, the second doping region 212a, and the third doping region 212b are high-voltage well regions, and have a doping concentration in a range of about $1.0 \times 10^{15}$ to $1.0 \times 10^{16}$ ions/cm$^3$. Alternatively, the second doping region 212a has a doping concentration that is the same as that of the first doping region 202 and is different from that of the third doping region 212b. For example, the first doping region 202 and the second doping region 212a are high-voltage well regions and have a doping concentration in a range of about $1.0 \times 10^{15}$ to $1.0 \times 10^{16}$ ions/cm$^3$. Moreover, the third doping region 212b is a well region and has a doping concentration in a range of about $1.0 \times 10^{16}$ to $1.0 \times 10^{17}$ ions/cm$^3$. Namely, the doping concentration of the third doping region 212b is higher than that of the first doping region 202 and the second doping region 212b.

Refer to FIG. 2D, a field reduction region 216 having the first conductivity type that is formed in the second doping region 212a and below the field insulating layer 220, so as to reduce surface field. In one embodiment, the field reduction region 216 has a doping concentration of about $1.0 \times 10^{17}$ ions/cm$^3$. Next, a gate structure 233 may be formed by a conventional MOS process, in which the gate structure 233 partially covers the field insulating layer 220 above the field reduction region 216. The gate structure 233 typically includes a gate dielectric layer 230 and a gate layer 232 on the gate dielectric layer 230.

Next, refer to FIG. 2E, a source region 227 is formed in the body region 222, and a drain region 228 is formed in the second doping region 212a. The source region 227 is formed of a doping region 226 having the second conductivity type and a doping region (which serves as a body contact region) 224 having the first conductivity type. Moreover, the drain region 228 is merely formed of a doping region having the second conductivity type.

Next, refer to FIG. 2F, a metallization layer is formed on the epitaxial layer 210 by a conventional metallization process to cover the gate structure 233. As a result, the high-voltage semiconductor device 20 is completed. In one embodiment, the metallization layer may include an ILD layer 250 and interconnect structures 240, 242, and 244 in the ILD layer 250. In the embodiment, the interconnect structure 240 is electrically connected to the source region 227 to serve as a source electrode, the interconnect structure 242 is electrically connected to the drain region 228 to serve as a drain electrode, and the interconnect structure 244 is electrically connected to the gate structure 233 to serve as a gate electrode.

It should be understood that the high-voltage semiconductor devices 30, 40, 50, and 60 respectively shown in FIGS. 3A to 3D can be fabricated by a method that is the same as or similar the method shown in FIGS. 2A to 2F.

According to the foregoing embodiments, doping regions having a conductivity type that is different from that of the body region are formed on both opposite sides and the bottom of the body region. These doping regions constitute a continuous isolation structure to isolate the body region from the substrate in the high-voltage semiconductor device, in which the body region and the substrate have the same conductivity type. Accordingly, when the source region is coupled to an internal circuit or resistor, the body effect can be reduced or eliminated to prevent the driving current from reducing with increasing the voltage applied to the source region. As a result, the performance of the high-voltage semiconductor device can be maintained or increased. Moreover, these doping regions may have the same doping concentration, so that the high-voltage semiconductor device has a stable peak electric field. Additionally, since the high-voltage well region(s) in the high-voltage semiconductor device can be utilized to form the continuous isolation structure, there is no additional manufacturing cost for the isolation structure.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-voltage semiconductor device, comprising:
   a semiconductor substrate having a first conductivity type;
   a first doping region having a second conductivity type in the semiconductor substrate;
   an epitaxial layer on the semiconductor substrate;
   a body region having the first conductivity type in the epitaxial layer on the first doping region;
   a second doping region and a third doping region that have the second conductivity type, respectively in the epitaxial layer on both opposite sides of the body region, so as to adjoin the body region, wherein the second doping region and the third doping region are in contact with the body region;
   a source region and a drain region respectively in the body region and the second doping region;
   a field insulating layer in the second doping region between the source region and the drain region; and
   a gate structure on the epitaxial layer to cover a portion of the field insulating layer.

2. The device as claimed in claim 1, further comprising a field reduction region having the first conductivity type that is in the second doping region below the field insulating layer.

3. The device as claimed in claim 1, wherein the first doping region, the second doping region, and the third doping region have the same doping concentration.

4. The device as claimed in claim 3, wherein the first, second, and third doping regions are high-voltage well regions.

5. The device as claimed in claim 4, wherein the second and third doping regions are formed by separating a high-voltage well region via the body region.

6. The device as claimed in claim 3, wherein the first doping region is a buried layer having the second conductivity type and the second and third doping regions are high-voltage well regions.

7. The device as claimed in claim 1, wherein the first doping region has a doping concentration that is from the same as that of the second doping region and different from that of the third doping region.

8. The device as claimed in claim 7, wherein the first doping region and the second doping region are high-voltage well regions and the third doping region is a well region, and wherein the well region has a doping concentration that is greater than that of the high-voltage well regions.

9. The device as claimed in claim 6, wherein the first doping region is a buried layer having the second conductivity type and the second and third doping regions are well regions.

10. The device as claimed in claim 1, further comprising a buried layer having the second conductivity type in the first doping region below the body region.

11. The device as claimed in claim 1, wherein the second and third doping regions are on the first doping region and the third doping region has an exterior edge that is aligned with a corresponding exterior edge of the first doping region.

12. The device as claimed in claim 1, wherein the second and third doping regions are on the first doping region and the third doping region has an exterior edge that is not aligned with a corresponding exterior edge of the first doping region.

13. The device as claimed in claim 1, wherein the third doping region has a width in a range of 1 μm to 8 μm.

14. A method for fabricating a high-voltage semiconductor device, comprising:
   providing a semiconductor substrate having a first conductivity type;
   forming a first doping region having a second conductivity type in the semiconductor substrate;
   forming an epitaxial layer on the semiconductor substrate;
   forming a body region having the first conductivity type in the epitaxial layer and forming a second doping region and a third doping region that have the second conductivity type, respectively in the epitaxial layer, wherein the body region is on the first doping region, and the second and third doping regions are on both opposite sides of the body region, so as to adjoin the body region, wherein the second doping region and the third doping region are in contact with the body region;
   forming a field insulating layer in the second doping region;
   forming a gate structure on the epitaxial layer, wherein the gate structure covers a portion of the field insulating layer; and
   forming a source region in the body region and forming a drain region in the second doping region.

15. The method as claimed in claim 14, further comprising forming a field reduction region having the first conductivity type in the second doping region below the field insulating layer.

16. The method as claimed in claim 14, wherein the first doping region, the second doping region, and the third doping region have the same doping concentration.

17. The method as claimed in claim 16, wherein the first, second, and third doping regions are high-voltage well regions.

18. The method as claimed in claim 17, wherein the second and third doping regions are formed by separating a high-voltage well region via the body region.

19. The method as claimed in claim 16, wherein the first doping region is a buried layer having the second conductivity type and the second and third doping regions are high-voltage well regions.

20. The method as claimed in claim 14, wherein the first doping region has a doping concentration that is the same as that of the second doping region and different from that of the third doping region.

21. The method as claimed in claim 20, wherein the first doping region and the second doping region are high-voltage well regions and the third doping region is a well region, and wherein the well region has a doping concentration that is greater than that of the high-voltage well regions.

22. The method as claimed in claim 20, wherein the first doping region is a buried layer having the second conductivity type and the second and third doping regions are a high-voltage well region and a well region, respectively.

23. The method as claimed in claim 14, further comprising forming a buried layer having the second conductivity type in the first doping region, wherein the buried layer is below the body region.

24. The method as claimed in claim 14, wherein the second and third doping regions are on the first doping region and the third doping region has an exterior edge that is aligned with a corresponding exterior edge of the first doping region.

25. The method as claimed in claim 14, wherein the second and third doping regions are on the first doping region and the third doping region has an exterior edge that is not aligned with a corresponding exterior edge of the first doping region.

26. The method as claimed in claim 14, wherein the third doping region has a width in a range of 1 μm to 8 μm.

\* \* \* \* \*